United States Patent [19]

Winn et al.

[11] 4,025,913
[45] May 24, 1977

[54] ELECTRICAL FIELD SENSING AND TRANSMITTING APPARATUS

[75] Inventors: William Paul Winn; Leon Geddis Byerley, III, both of Socorro, N. Mex.

[73] Assignee: The United States of America as represented by the Secretary of the Navy, Washington, D.C.

[22] Filed: Dec. 22, 1975

[21] Appl. No.: 642,926

[52] U.S. Cl. .............................. 340/189 M; 244/32; 324/72; 325/113; 343/706
[51] Int. Cl.² .................. G08C 17/00; H04B 1/034
[58] Field of Search .................. 340/184 M, 177 R; 325/111, 113, 115; 343/706; 244/31, 32; 324/72; 317/262 E, 262 AE

[56] References Cited

UNITED STATES PATENTS

| 674,427 | 5/1901 | Palencsar | 343/706 |
| 911,260 | 2/1909 | Pennock | 343/706 |
| 2,409,155 | 10/1946 | Schellens et al. | 325/113 |
| 3,273,066 | 9/1966 | Ruhnke | 340/189 M |
| 3,458,805 | 7/1969 | Kasemir | 324/72 |
| 3,614,031 | 10/1971 | Demboski | 244/32 |
| 3,925,726 | 12/1975 | Few | 324/72 |

OTHER PUBLICATIONS

Runnalls, "Bluebird Racer's Telemetry System," *Electronics*, Oct. 28, 1960, pp. 70–72.

Primary Examiner—John W. Caldwell
Assistant Examiner—James J. Groody
Attorney, Agent, or Firm—Richard S. Sciascia; Paul N. Critchlow

[57] ABSTRACT

A pair of conductive spherical shells are carried by a balloon or other means into an electrical field which induces equal and opposite charges on the shells. Rotation of the shells causes the charges to alternate. The alternating sinusoidal charge is applied to an amplifier and the amplified output modulated and applied to a transmitter. The spherical shells become a telemetry antenna for transmitting the sensed electrical field information to a remote receiver.

2 Claims, 4 Drawing Figures

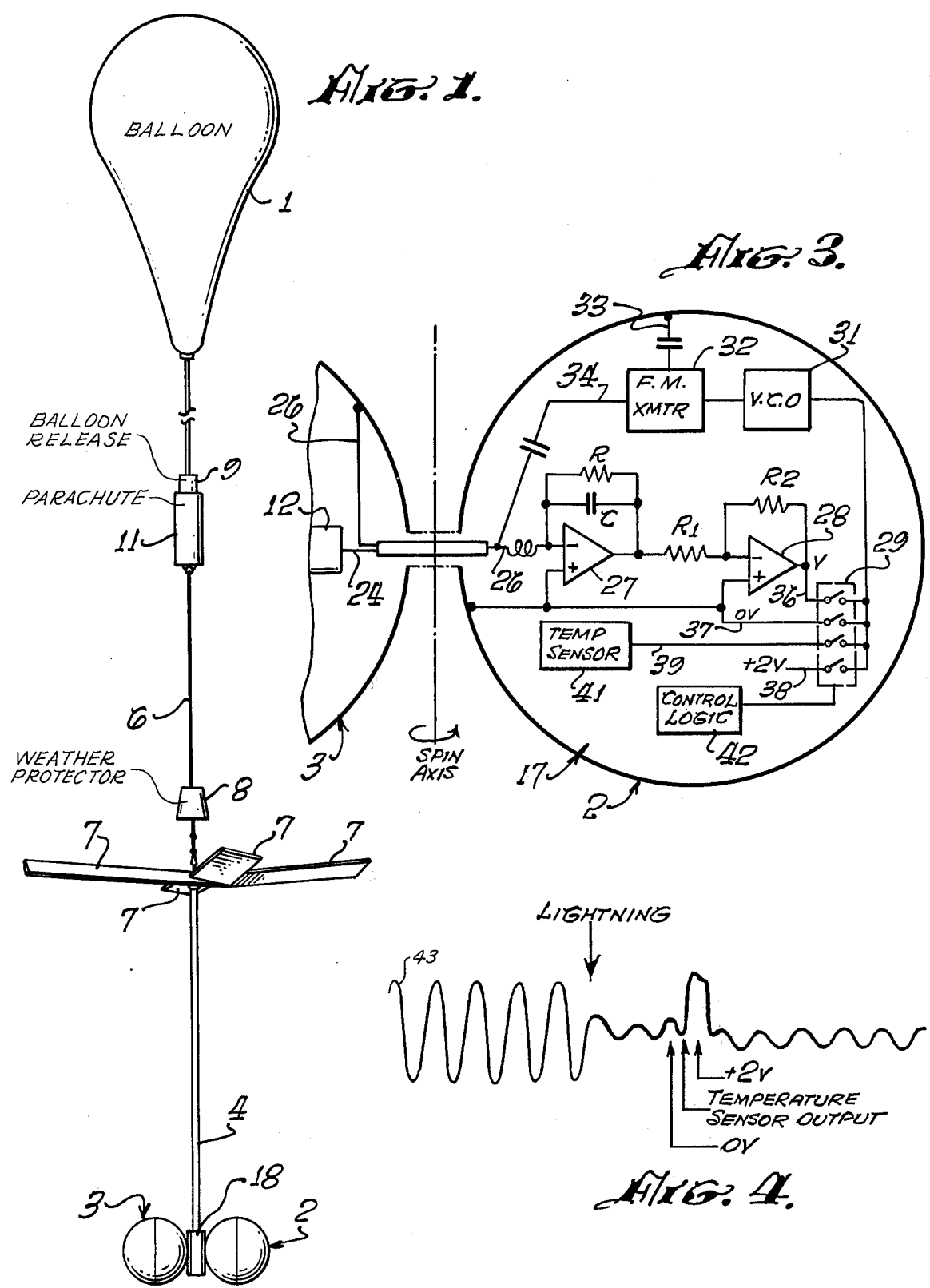

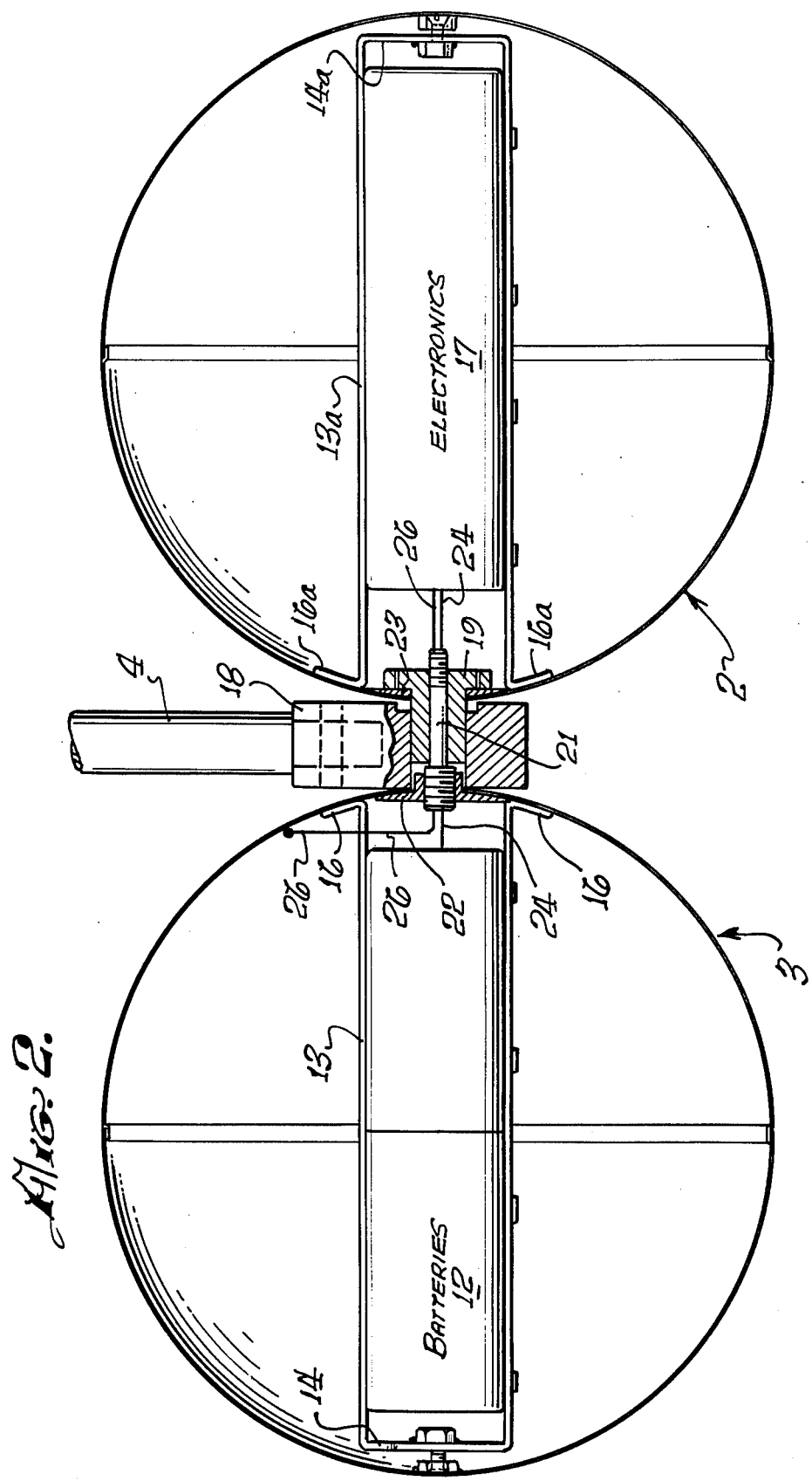

ELECTRICAL FIELD SENSING AND TRANSMITTING APPARATUS

BACKGROUND OF THE INVENTION

The invention relates to apparatus for sensing and transmitting environmental information.

As will become apparent, the present invention, which will be referred to as an electric field meter, has been developed primarily for the purpose of measuring the growth of electrical fields in thunderclouds. For this reason, the ensuing discussion will be particularly with regard to the thundercloud application. Other uses, however, are considered to be within the present inventive scope.

There have been a number of previous efforts directed at obtaining reliable data regarding the growth and behavior of electric fields in thunderclouds. In particular, various investigators and authors have predicted that the behavior of the electric field in a cloud should be different than that at ground. For one reason, the electric field at the ground is affected by point discharge from the ground. Also, it is a fact that the air outside of clouds, especially at high altitudes, has known finite conductivity. Consequently, estimates based upon measurements made outside of a cloud, such as at ground level, are not reliable and their unreliability leaves unresolved several important questions. For example, it is important to determine how the behavior of the electric field in the cloud compares with that at the ground. Also, reliable data is needed regarding the total quantity of the charge in regions affected by lightning as well as such matters as the behavior of the electric field as a function of time inside a cloud at a point fixed relative to the cloud. Obviously, data capable of providing reliable estimates must be obtained from positions directly within the cloud. Also, it is important, particularly in obtaining the so-called 'recovery curves' (electrical field strength vs. time between lightning flashes) to assure to the maximum possible extent that the measurements are obtained from a fixed disposition relative to the cloud. To obtain such data, some previous investigators have utilized slowly moving vehicles, such as balloons or parachutes to carry the sensing instrumentation into cloud formations. For example, the following authors have described results obtained by releasing free balloons with instruments that measured the corona current through a long vertical wire:

Simpson, G. C. and Scrase, F. J., 1937, 'The distribution of electricity in thunderclouds,' *Proc. R. Soc. London A*, 161, pp. 308-352.

Simpson, G. C. and Robinson, G. D., 1940, 'The distribution of electricity in thunderclouds, II,' *Proc. R. Soc. London A*, 177, pp. 281-329

Chapman, S, 1953, 'Thundercloud electrication in relation to rain and snow particles,' *Thunderstorm Electricity*, Chicago Press, pp. 207-230

Yüan, C., Chiang, P., Jan, L., Chou, S., and Chen, T., 1965, 'A stong electrical field radiosonde and analysis of results obtained in thunderclouds,'*Ch'i-hsiang Hsueh-pao (Acta Meterologica Sinica)*, 35, pp. 440-448.

However, although these authors were able to deduce the sign of the vertical component of the field, their estimates of the magnitude of vertical component were very rough because magnitude is related to the corona current by a non-linear function that varies with altitude. Other recorded data has been obtained by W. H. Evans, 1969, 'Electric fields and conductivity in thunderclouds,' *J. Geophys. Res.*, 74, pp. 939-948, and W. D. Rust and C. B. Moore, 1974, 'Electrical conditions near the bases of thunderclouds over New Mexico,'- *Quart. J. R. Met. Soc.*, 100, pp. 450-468. The data reported by Evans was obtained by employing parachuteborne instruments while the Rust and Moore records were obtained with the use of a captive balloon. J. A. Chalmers in a review appearing in 1967, *Atmospheric Electricity*, Pergamon Press, also describes a so-called "electronic flux meter" which has proven to be a useful device that in some respects is related to the present meter.

The present invention is particularly concerned with providing an improved electric field meter which is slowly moved vertically up and down through a cloud formation preferably by a balloon and parachute. In particular, it provides a combination field sensor and telemetry antenna by means of which the sensed information can be transmitted to a data-collection center for comparison with other data obtained at ground level.

The objects of the invention are concerned generally with obtaining reliable data relative to the matters which have been discussed. Also, as will become apparent, the invention seeks to obtain this data by the use of expendable apparatus or, in other words, apparatus that is so simple and inexpensive that its recovery costs normally would exceed its fabrication cost.

BRIEF DESCRIPTION OF THE DRAWINGS

The present invention is illustrated in the accompanying drawings of which:

FIG. 1 is a somewhat schematic illustration of the present meter suspended from a balloon, and FIG. 2 is a sectional view of the two-sphere meter showing its electronics and power supply in block form;

FIG. 3 is a view similar to FIG. 2 showing primarily a circuit diagram for achieving the present sensing and transmitting functions, and FIG. 4 is a short segment of actual recorded data obtained by using the present system.

DETAILED DESCRIPTION OF THE INVENTION

FIG. 1 illustrates one intended use of the present apparatus in which it is suspended in a cloud formation by means of a balloon 1. The electric field meter portion of the apparatus consists generally of a pair of hollow spherical casings or shells 2 and 3 in which are mounted the sensing and amplifying components. A support rod 4 and flexible line 6 secure the spheres to the balloon and, of particular interest, rotator blades or propellers 7 are secured to and project radially from rod 4. The attachment fittings for coupling the rod and line should permit free rotation of the rod relative to the balloon. A bell-shaped weather protector 8 aids in keeping moisture, etcetera away from the fittings.

As will be apparent, the balloon is used to carry sensor casings 2 and 3 aloft into a cloud formation to measure its electric field strength. The function of propellers 7 is to rotate the rod and the sensor casings during ascent. The spherical casings, being conductive, receive an induced charge from the electric field and, in a particular manner to be described, this charge is transmitted to a ground station or the like.

At a predetermined or selected level, the balloon is freed by actuating a release device such as an explosive squib 9. At the same time a parachute 11 is released to permit the meter apparatus to descend at a controlled rate. Field measurements are obtained during descent as well as ascent. The explosive squib and parachute release can be implemented in any desired manner so that it functions either responsively to a ground control or automatically at a timed interval or a predetermined altitude.

Considering the identified components in greater detail, balloon 1, in practice, is made of 0.02 mm thick polyethylene inflated to a diameter of about 2.5 m so that the total lifting force is between 1.5–2 times the weight of the load. Thus the balloon rises even after accumulating some water and ice. Ascent velocities before entering clouds typically are 3 to 5 m/s. Neoprene meterological balloons initially were tried but they often burst before reaching the cloud base apparently as a result of hail impacts.

Contained parachute 11 is placed about 5 m above spherical casings 2 and 3. It simply is a 1.2 m square of polyethylene with shroud lines from each corner. Descent velocity is about twice the ascent velocity. As has been indicated, no attempt is made to recover the electric field meters since they are inexpensive compared to the cost of finding and recovering them in the usually rugged terrain in which they are used.

Spherical casings 2 and 3 formed of hollow copper spheres of about 15 cm diameter and, as shown best in FIG. 3, they are held in a manner to be described, 1.9 cm apart at the bottom end of rod 4. The spherical shape is an important feature since it minimizes corona discharge which undesirably affects the reliability of the electric field measurements. Corona discharge from rotator blades 7 also is a factor to be considered since, during ascent, the vertical winds tend to carry such space charges past the spheres so as to contribute to the electric field component that is being measured. To minimize this undesired effect, the blades, which are made of balsa wood, are coated with a urethane finish. Other precautions also can be taken although, generally, it has been found that the blade rotation which is high at the blade tips prevents water from accumulating.

The sensing and transmitting functions of the meter are provided by spheres 2 and 3 and by the components contained in their hollow interiors. FIG. 2 shows their structure and support while FIG. 3 illustrates the system electronics. As shown in FIG. 2, each sphere is formed of lapped hemispheres which facilitate fabrication. Sphere 3 in the implementation contains the power supply for the system which is a battery pack 12 mounted on a bracket support 13 having an outer end 14 securely bolted to the sphere and an open-flanged inner end 16 which is soft-soldered to the sphere. Sphere 2, correspondingly contains the system electronics of block 17. The mounting for the electronics is achieved by a bracket 13a formed and secured in the same manner as bracket 13.

For reasons which will become apparent, spheres 2 and 3 should be mutually insulated as well as spaced one from the other a fixed distance. To achieve these purposes, the bottom end of rod 4 is received and pinned in a spacer block 18 formed of a dielectric material, such as teflon. Block 18, in turn, is formed with a transverse bore receiving a nut 19 also formed of an insulating material. A bolt 21 is threaded into nut 19 to secure the two spheres in their spaced disposition. Inserts 22 and 23 are fitted flush against the inner arcuate walls of each sphere to accommodate the nut and bolt arrangement. Obviously, other arrangements can be substituted. It is, however, important to note that the present bolt 21 is provided with a central bore to receive a conductor 24 which supplies the battery power to the system electronics. It also is to be noted that another conductor 26 conducts the charge induced on sphere 3 to the system electronics for amplification and transmission. Again, the particular paths for the leads is purely a matter of choice although the fact that the charge on the casings are interconnected through the electronics is a significant feature.

The circuitry illustrated in FIG. 3 amplifies and transmits the so-called charge received through lead 26 from spherical casing 3. Conventional electronic circuitry is used and, of course, it can be modified in any desired manner providing it achieves the desired functions. Included are a pair of amplifiers 27 and 28, a switch arrangement 29 and a voltage controlled oscillator (VCO) 31 to modulate the switched outputs for application to an FM transmitter 32 which, in turn is electrically coupled to both spheres by conductors 33 and 34. It also should be noted that the amplifiers are grounded to the copper surface of spherical casing 2.

A better understanding of the operation of the meter can be obtained by considering the nature of the charges induced on the spherical casings when they are carried into an electrical field by balloon 1. First, however, it is to be noted that the illustrated arrangement is intended primarily to measure the strength of the horizontal component of the electrical field into which it is carried. Modifications, which will be discussed, can be made if, for example, the vertical, another component, such as is involved.

As to the charges induced on spheres 2 and 3, there are two important factor to be noted. First, due to the arrangement, these charges will be equal and opposite. Thus, because the spheres are coupled through conductor 26, there will be a charge transfer between the spheres when they are disposed in the electrical field and the transfer will result in a positive charge on one sphere, such as sphere 2, and a negative charge on the other. The second important factor is that, as the apparatus is borne aloft by balloon 1, the vertical wind causes the rotator blades to rotate rod 4 so that the spheres rotate in a horizontal direction on the longitudinal axis of the rod. Although the spin rate can be a matter of choice, the present apparatus achieved a rate of 3 rps.

Rotation of the spheres alternates their relative positons to cause the charge to alternate. This alternation results in a sinusoidally varying input through line 26 to the amplifiers so that this input can be amplified, modulated and transmitted. Further, the fact that the spheres are disposed to receive horizontal field component charges coupled with the fact that the rotational axis of the spheres is normal to this horizontal component, assures output data representative of the amplitude variations of this component. The mathematical symbol used to designate the horizontal component is $\underline{E} \perp$ and, as stated, the desired output of illustrated apparatus is $\underline{E}\perp$. If there is a pendulum motion during the balloon or parachute flight, the vertical component will be introduced to cause a modulation of the sinusoidal signal. If this component is to be determined, the amount of modulation and the instruments maximum angle of pendulum excursion can be employed. Also, as will be discussed, other geometries can be used and other rotational drives employed to permit investigations of any desired components.

Although the electronics of FIG. 3 is straightforward, there are several factors to be especially noted. As has been described, it is important that the charge on sphere 3 be applied through the amplifiers, et cetera to the other sphere and that the output of transmitter 32 be applied to the spheres. Insulation of the spheres is used to assure that all of the charge is applied to the amplifiers.

Switching arrangement 29 is employed because it is important to provide reference voltages to permit calibration of the entire telemetry and recording components of the system. As would be expected, the transmitted data is recorded at a ground station. FIG. 4 shows a short segment of one of the records. In addition to the reference voltages, it is important in thundercloud investigations to obtain temperature data related to the event being recorded. For these purposes, the system employs a switching arrangement having four inputs. Thus, as shown, switch 29 has an input 36 which is the amplifier output for the signal of interest and inputs 37, 38 and 39. Inputs 37 and 38 are reference voltages used for calibrations while input 39 is directly from a temperature sensor 41. Each input has its own switch arm and the switch operation is controlled by a control logic 42 to connect and disconnect the inputs in a desired time sequence. In practice, as shown in FIG. 4, the normal output of the instrument is a sine wave 43. A lightning event which is marked on FIG. 4 interrupts the sine wave and is recorded. Thereafter, the switches disconnect the electric field signal every 5 seconds and connect, in sequence, the reference voltage OV, the temperature sensor output and the +2V reference. It will be appreciated that other sensors and other references can be added as desired.

In practice, the value of $\underline{E} \perp$ can be derived from $V_o$ by solving the electrostatic problem of two spheres in a uniform external field for the relation between $\underline{E} \perp$ and the charges Q and $-$Q induced on the spheres and by analyzing the circuit for the relation between Q and $V_o$. These derivations have been made and the result is that:

$$\underline{E} \perp = -(8.8 \times 10 \text{ inches})(1+(\omega RC)^{-2})^{1/2} A^{-1}CV_o$$

(in S1 units)

The constant $8.8 \times 10^{11}$ volts meter$^{-1}$ Coul$^{-1}$ is the ratio of electric field to induced charge for 15 cm diameter spheres held 1.9 cm apart; $\omega$ is the angular spin rate (radians/s) of the spheres about the vertical rod, R and C are the feedback resistance and capacitance of the charge amplifier 27 and A is the gain of the second amplifier. A value for $V_o$ and thus $\underline{E} \perp$ is obtained for each half revolution which corresponds to a time of less than 0.2 sec. and a vertical ascent (or descent) distance relative to the surrounding air of less than 1 meter.

The operation of the apparatus should be clear from the foregoing description. In use, significant data has been recorded in which corona effect and the effect of finite conductivity of the air outside a cloud seem to be negligible. Measurements of the electric field within a cloud just before and after a lightning flash, when combined with measurements at the ground, can be used to obtain a value for the total quantity of charge in a region of the cloud just before it is partially discharged by lightning. Also, an occasion, the shape of the so-called recovery curves have been obtained for comparison with theoretical models. The recovery data is achievable in situations where there are frequent lightning flashes and the electric field appears to be a slowly varying function of position in the vicinity of the balloon.

There are a number of factors which should provide some confidence in the use of the illustrated arrangement. Thus, although the copper spheres and rotating blades both may accumulate a net electrical charge by capturing or releasing charged particles or by going into corona discharge, this accumulated charge does not move relative to the instrument and thus it does not contribute to the sinusoidal output voltage. In general, the collection and breaking away of charged particles, such as precipitation particles, produces such a small step voltage that it is too small to resolve on the records. Noise, such as might be caused by collisions, is not typically present in the records and the few examples where it has appeared probably were due to the somewhat microphonic nature of the FM transmitter. As another factor, it has been found that the spin rate of the spheres are usually reasonably constant. Variations, of course, can affect the calibrations and they can occur due to accumulations of ice which adds mass to the instrument. However, such variations as have been noted lasted only for a short period of time and were distinquishable.

It is again to be noted that the apparatus shown in the drawings is intended only as an example of a successful arrangement and that other arrangements and applications are well within the purview of the present invention. For example, the illustrated arrangement utilizes two spheres 2 and 3. The same purpose can be served using a single sphere divided into two insulated hemispheres. The two spheres are preferred because they serve as two halves of a biconical antenna and thus have a characteristic impedance that is mostly resistive at the chosen telemetry frequency of 400 MHz. Two insulated hemispheres would have a large capacitative part which would impose difficulties. Even so, the hemisphere arrangement may be better adapted for some purposes and its use is contemplated provided, as indicated, the two halves combine to provide a spherically-shaped pair of mutually-insulated casings or shells. Further, to avoid loss of charge Q, one casing should be electrically coupled through the amplifiers circuitry to the other casing.

It also is well within present contemplation to use the arrangement for purposes other than thundercloud studies. For example, it is important to monitor the electric field charge near storage tanks or other areas containing explosives. In these situations and others, the balloon is not needed. Instead, the spheres can be mounted in a fixed position and rotated positively at any desire spin rate. Further, the disposition of the spheres is not necessarily relative to the horizontal component of the electric field. Any desired disposition can be used and rotation either can be about a horizontal axis or precessed in a controlled manner to obtain information on various components. The basic idea common to all such uses is that of employing the spherical pair to induce the essential potential difference which then is converted into a sinusoidal input for amplification and transmission. It is a significant consideration that this basic arrangement can be implemented in a relatively simple and inexpensive manner to reliably sense the electrical field and simultaneously transmit it using the same spherical arrangement used in the sensing.

It has been indicated that measurements obtained with the present instruments are utilized in conjunction with field changes obtained at the ground. The ground measurements, of course, are not a part of the present invention. However, one manner in which they may be used may be helpful in utilizing the present system. In particular, information or estimates about the net quantity of negative charge present inside thunderclouds can be obtained if both the quantity of charge neutralized and the ratio of charge neutralized to the total amount present is known. Measurements of abrupt field changes at ground accompanying lightning and of the location of the charge that was neutralized together give values of the quantity of charge neutralized. Brook et al., 1962, "Quantitative Study of Strokes and Continuing Currents in Lightning Discharges to Ground", J. Geophys. Res, 67, pp 649–659 discuss this aspect of the measurements. Measurements obtained with the present instruments provide the values necessary to obtain an estimate for the ratio. Such estimates appear to be true on an average although actual fractional variations between the compared values may be more or less than the assumed constant.

Obviously many modifications and variations of the present invention are possible in the light of the above teachings. It is therefore to be understood that within the scope of the appended claims the invention may be practiced otherwise than as specifically described.

We claim:

1. Apparatus for measuring the magnitude of the horizontal component of an electrical field in a thundercloud environment comprising:
   electrical field charge collecting and transmitting means including:
   a pair of substantially identical spherically shaped hollow electrically-conductive casings disposed in a closely-spaced side-by-side arrangement,
   spacer block means for maintaining said side-by-side arrangement, said block means being formed of a dielectric material for structurally insulating said casings one from the other,
   a charge amplifier mounted within one of said casings and provided with an input and output,
   charge conduction means coupling one of said casings to said input, and
   a second charge conducting means electrically coupling said amplifier output to said casings for utilizing the pair as a transmitter antenna; and
   means for carrying said collecting and transmitting pair of casings upwardly into and downwardly out of said thundercloud environment, said means including:
   a balloon for producing said upward movement,
   rigid rod-like suspension means having its upper end carried by said balloon and its lower end fixedly secured to said spacer block means
   controllable release means carried by said suspension means for releasing said balloon,
   parachute means coupled to said rod-like suspension means below said release means, said means being operable upon balloon release for controlling the downward movement of said casing pair, and
   propeller means fixedly secured to said suspension means below said parachute means for rotating said rod-like means and said casing pair during said upward and downward movement,
   said pair of casings having a common horizontal axis normally aligned during said upward and downward movement with said horizontal component of the thundercloud field whereby the propeller-induced rotation of said casing pair produces a transmittable sinusoidal amplifier output corresponding in magnitude to said horizontal component of the electrical field, said sinusoidal output being applied to said casing pair for transmission.

2. The apparatus of claim 1 wherein said second charge-conducting means includes means for modulating said transmittable sinusoidal amplifier output.

* * * * *